United States Patent [19]

Kimura et al.

[11] 4,414,665

[45] Nov. 8, 1983

[54] SEMICONDUCTOR MEMORY DEVICE TEST APPARATUS

[75] Inventors: Kenji Kimura, Saitama; Shigeru Sugamori, Gyoda; Kohji Ishikawa, Funabashi; Naoaki Narumi, Tokyo, all of Japan

[73] Assignees: Nippon Telegraph & Telephone Public Corp.; Takeda Riken Kogyo Kabushikikaisha, both of Tokyo, Japan

[21] Appl. No.: 206,902

[22] Filed: Nov. 14, 1980

[30] Foreign Application Priority Data

Nov. 21, 1979 [JP] Japan ............................. 54-150897
Nov. 21, 1979 [JP] Japan ............................. 54-150898

[51] Int. Cl.³ ............................................. G06F 11/26
[52] U.S. Cl. ........................................ 371/21; 364/900; 365/201
[58] Field of Search ... 364/200 MS File, 900 MS File; 371/21, 20, 25, 27, 71, 24; 340/146.2; 324/73 R, 73 AT; 365/201

[56] References Cited

U.S. PATENT DOCUMENTS

| 3,517,305 | 6/1970 | Schwartz et al. | 371/24 |
|---|---|---|---|
| 3,579,199 | 5/1971 | Anderson et al. | 371/21 |
| 3,622,987 | 11/1971 | Borkan | 340/146.2 |
| 3,719,929 | 3/1973 | Fay et al. | 371/24 |
| 3,751,649 | 8/1973 | Hart, Jr. | 371/20 |
| 4,001,818 | 1/1977 | Radichel et al. | 371/25 |
| 4,099,668 | 7/1978 | Feilchenfeld et al. | 371/20 |
| 4,195,770 | 4/1980 | Benton et al. | 371/21 |
| 4,271,512 | 6/1981 | Lyhus | 371/25 |
| 4,293,950 | 10/1981 | Shimizu et al. | 371/21 |
| 4,300,234 | 11/1981 | Maruyama et al. | 371/21 |
| 4,313,200 | 1/1982 | Nishivra | 371/20 |
| 4,317,200 | 2/1982 | Wakatsuki et al. | 371/21 |

OTHER PUBLICATIONS

*IBM Technical Disclosure Bulletin*, vol. 22, No. 7, Dec. 1979, pp. 2837-2838, "Memory Test System", Anolick, Camenga and Chen.
Tutorial-LSI Testing, 2nd Ed., W. Fee, Compcon 1977, Spring, San Francisco, CA, pp. 81-88 (IEEE).

*Primary Examiner*—Mark E. Nusbaum
*Assistant Examiner*—Gary V. Harkcom
*Attorney, Agent, or Firm*—Staas & Halsey

[57] ABSTRACT

A memory device under test is accessed by an address generated by a pattern generator to write therein data and to read the data out to be compared with expected data, and the comparison result is stored in the fault-address memory by the same address after reading out therefrom the content of the address. When a disagreement is detected through the comparison, it is counted; however, the count operation is inhibited if the data read out from the fault-address memory is a fault data. When the counted number exceeds a predetermined value, a fault signal is generated. After the test is terminated, an address counter is operated, the fault-address memory is read out by the content of the address counter, and when fault data is detected from the output read out, the content of the address counter is fetched into the CPU.

14 Claims, 11 Drawing Figures

SEMICONDUCTOR MEMORY DEVICE TEST APPARATUS

BACKGROUND OF THE INVENTION

This invention relates to a test apparatus for testing whether a semi-conductor memory device under test can perform correct read and write operations so that the apparatus can analyze the cause of any faults that are detected.

The general operational procedure of the semiconductor memory testing apparatus is first to generate an address and write-in data by the pattern generator, to access the memory under test using the generated address and to write in said write-in data, to access and read out the memory under test using said address, and to compare the read-out data with an expected data or with a correct data to inspect whether the memory device carries out the correct read/write operation. There have been proposed a number of patterns appropriate for such evaluation as the sequence of address generation, that is, the control of the address pattern for writing and reading. The so-called "Walking pattern", "Galloping pattern" and "Ping-Pong pattern" are well known patterns. The testing apparatus of this kind is in general designed to be able not only to test whether a memory device is defective or not but to detect faulty spots if the device is defective and further to analyze the cause of a fault.

In the prior art memory testing apparatus, when an inconsistency between a read-out data and an expected data occurs even only once during the test, the test is halted and the faulty memory is simply rejected as an unacceptable product. As the integration density of memory devices is getting high and thus the capacity thereof increases, the frequency of occurrence of faulty products grows while the available percentage decreases if the product is rejected due to only one faulty spot and, as a consequence, the cost of the acceptable products will be raised. Accordingly, it has been proposed to provide error correcting means when the faulty spots in a memory device are few, so that some percentage of faulty products all of which would conventionally be rejected can be saved as acceptable products. Another proposed possibility of saving some percentage of the faulty products is to use only the normally operating area of the memory device, leaving some area containing faulty spots unused. In this case, it is necessary to decide, for example, that when the number of faulty spots is less than a predetermined value, the memory device is acceptable, and when the number is more than the predetermined value, the device is unacceptable. In testing of this kind, it is usual to access one address twice or more for reading out during testing. Accordingly, it may not be allowed to judge the memory device acceptable only from the result that such a simple counting is less than a predetermined value. For this reason, such judgement that the product is acceptable if the number of faulty spots thereof is less than a predetermined value has not been employed.

Generally, the analysis of the causes of faulty spots of a memory device is performed such that when disagreement between the data read out and an expected data is detected, the address where the disagreement was detected is used as an address to access a fault-address memory and, to store therein the disagreement data and after completing the entire test, the contents of the fault-address memory are read out and supplied to the CPU to perform the fault analysis according to a predetermined procedure. In order to take the contents of the fault-address memory into the CPU, conventionally the CPU sequentially accesses each address of the fault-address memory and the read out data are taken into the CPU. The CPU judges whether the read out data are faulty or not and in which address the fault occurred. Alternatively, all the contents of fault-address memory are temporarily transferred to the storage of the CPU and then the CPU examines the contents of all of the addresses corresponding to the transferred data to perform the fault analysis.

However, in order to access each address of the fault-address memory and to take the content thereof into the CPU, it is necessary to have time equal to the product of one input/output cycle time multiplied by the number of addresses in the fault-address memory; therefore, if the number of addresses to be accessed is considerably large it takes a fairly long time for the CPU to read out the contents of the fault-address memory. In particular, if there are many faulty spots the CPU needs to fetch and store the corresponding faulty addresses, which does not cause a problem. However, in case of a large number of addresses with a few faulty spots, there is the disadvantage of taking a considerable time for detecting the few faulty spots.

SUMMARY OF THE INVENTION

An object of the present invention is to provide a memory test apparatus able to carry out high speed testing for a memory device through the steps of judging that if the number of faulty spots in the memory device exceeds a predetermined reference value the memory device is unacceptable, and terminating the test for said memory device, whereby the test can be executed and terminated in the real time mode or a faulty spot once tested will not have to be read out again.

Another object of the present invention is to provide faulty address incorporating means for fetching the contents of the fault-address memory within a very short time and at a very high speed.

According to the present invention, the disagreement between the data read out from the memory device under test and the expected data is detected by comparison in a comparison circuit. When a disagreement is detected at a certain address in the memory under test, the address is used to access a fault-address memory and to store therein a disagreement signal. However, every time before writing therein the disagreement signal, it is examined if a disagreement signal has already been written therein. If a disagreement signal has not yet been stored, the disagreement signal detected by the comparison circuit is counted by a counter. In this manner, it is protected from counting the disagreement signal generated from the same spot twice or more. When the count number reaches a predetermined value, a fault signal is generated. Thus, the memory device under test can be judged unacceptable when the number of faulty spots exceeds a predetermined value.

Moreover, according to the present invention, upon receiving an access command, an address counter provided in the test apparatus operates in a predetermined direction to generate addresses for sequentially reading out the fault-address memory, and the above mentioned address counter operation is halted when a fault data is detected among the read out data. Further, in response to the detection, the content of the address counter and, if required, the content read out from the fault-address memory are fetched into a control circuit, such as the CPU, and after this fetching the control circuit gives an access command to the address counter.

Thus, instead of using the control circuit for accessing addresses of the fault-address memory one by one, the address counter is adopted for sequentially accessing each address of the fault-address memory and only when a fault data is detected are the content of the address counter or the address of the fault-address memory at the time of detection, and further the content read out from the fault-address memory as required, read into the control circuit. Accordingly, since the reading into the control circuit is performed only when a fault data is detected in the fault-address memory, and since the number of fault data is generally small, the total time necessary for the control circuit to fetch all the data therein is very short. Thus, the time for accessing the address counter and the fault-address memory can be extremely shortened in comparison with the time for taking the entire data into the control circuit, whereby as a whole a high speed operation can thus be made possible to read the contents of the fault-address memory.

BRIEF DESCRIPTION OF THE DRAWINGS

FIG. 3A-H are time charts explaining a part of the operation of the apparatus illustrated in FIG. 2.

DETAILED DESCRIPTION OF THE PREFERRED EMBODIMENTS

Figure 1:
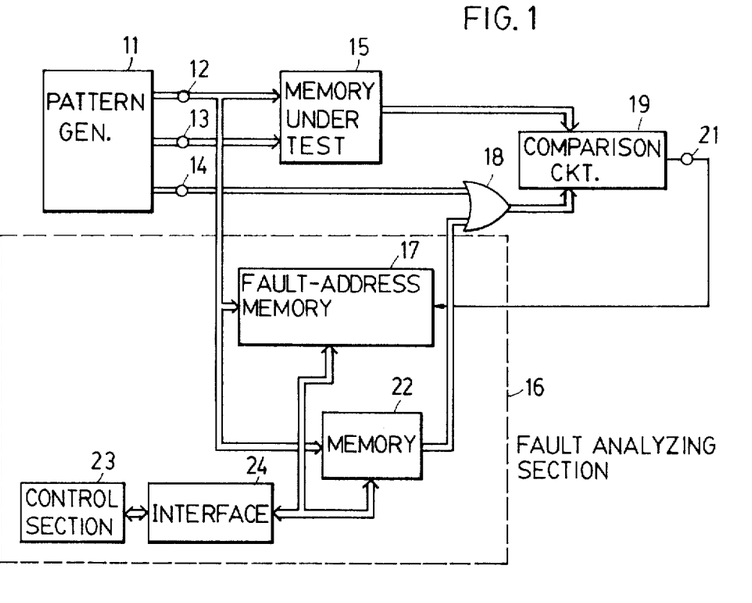
FIG. 1 is a block diagram illustrating the general configuration of a semi-conductor memory test apparatus according to the present invention.

FIG. 1 illustrates a general configuration of the memory test apparatus, in which an address from the terminal 12 of a pattern generator 11, a write-in data from the terminal 13 thereof, and an expected data from the terminal 14 thereof are outputted, respectively. In accordance with the address from the terminal 12, a memory device 15 under test and a fault-address memory 17 in a fault analyzing section 16 are accessed simultaneously. The write-in data from the terminal 13 is written in the accessed address of the memory device 15 under test. After the write operation, the memory device 15 is accessed and the corresponding data read out from memory device 15 and the expected data supplied from the terminal 14 through "or" circuit 18 are compared in comparison circuit 19. If both data do not coincide with each other, a disagreement signal is generated at a terminal 21 and the disagreement signal is stored in the fault-address memory 17. If the memory device 15 under test is a read-only memory, it is difficult to generate expected data therefor by means of logic operations, and thus the expected data are prestored in a memory 22 provided in the fault analyzing section 16. The memory 22 is accessed by the address from the terminal 12, and the read-out expected data is supplied to the comparison circuit 19. To analyze a faulty memory, a control section 23 comprising a CPU accesses the fault-address memory 17 via an interface 24, the read-out output from the memory 17 is loaded in the control section 23, and then the data so loaded is analyzed in a predetermined sequence.

Figure 2:
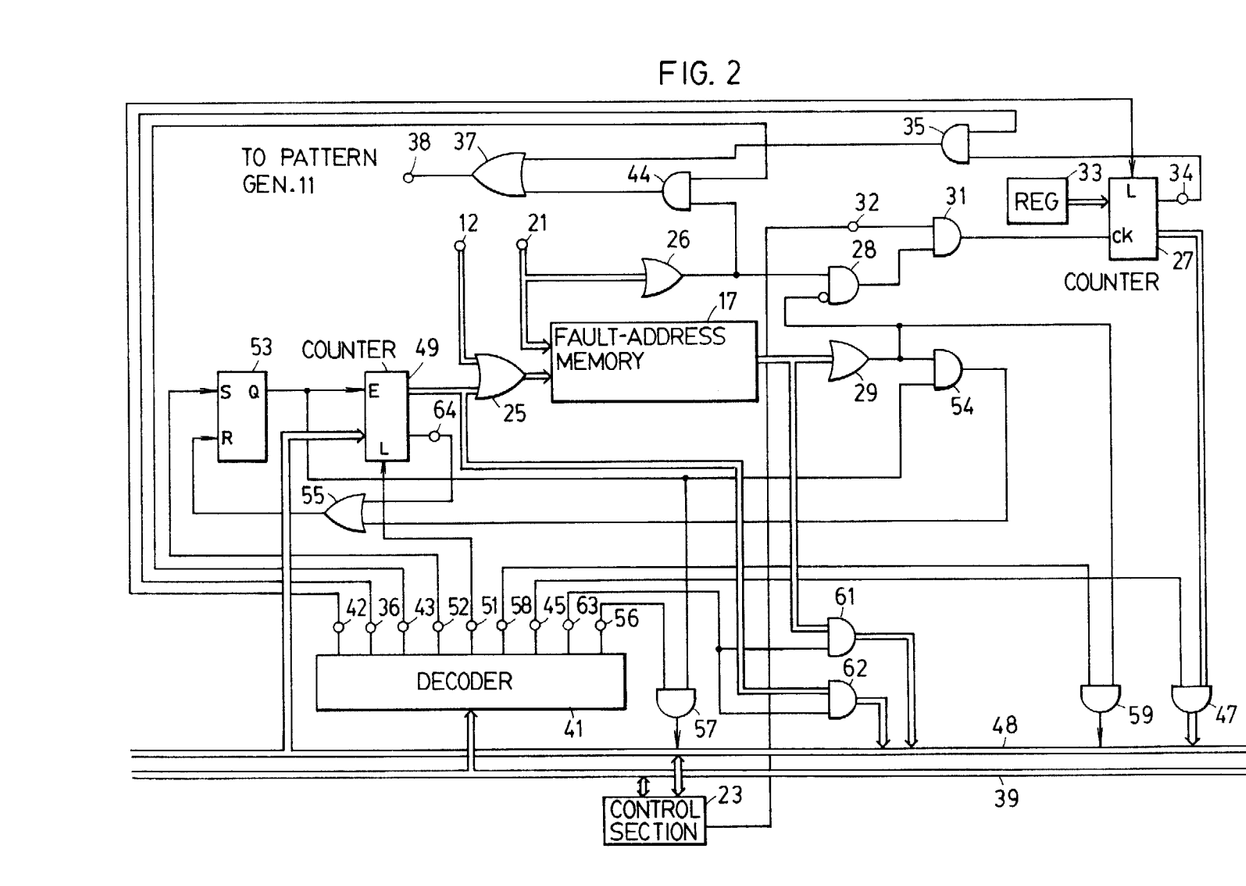
FIG. 2 is a block diagram illustrating the main part of an embodiment of the semi-conductor memory test apparatus according to the present invention.

FIG. 2 illustrates the main part of a semi-conductor memory test apparatus according to the present invention, in which the parts that coincide with those of FIG. 1 are commonly represented by the same numbers. In this example, a plurality of data bits are stored in each address of the memory device 15 (FIG. 1) under test, the data bits read out from the memory device 15 and the corresponding bits of the expected data are compared by the comparison circuit 19, and the results of the comparison for all the bits are sent through the terminal 21 (shown in FIG. 2 to comprise plural bits); to the fault-address memory 17 and written therein. The fault-address memory 17 is accessed by the address supplied from the terminal 12 through an OR-circuit 25. The results of the comparisons, consisting of a plurality of bits applied to the terminal 21, are fed for logic summation at an OR-circuit 26. If even only one bit among these is found to be inconsistent, it is counted by a counter 27. If, however, a disagreement has been previously detected for the same address, the cumulation by the counter 27 will not be executed. Further, the fault-address memory device 17 is read out by the address from the terminal 12, the output is taken for logic summation among the bits of the output by an OR-circuit 29, the output of the OR-circuit 29 is supplied to an inhibit gate 28, and also the output data from the OR-circuit 26 is supplied to the inhibit gate 28. The output data from this inhibit gate 28 is then supplied to an AND-gate 31 and the output data from the AND-gate 31 is provided to the clock terminal CK of the counter 27 by the clock signal supplied to the AND-gate 31 from a terminal 32. If an inconsistent output appears in the comparison circuit 19 (FIG. 1), the fault-address memory 17 is read out prior to supplying the counter 27 with the disagreement signal, and the read-out output controls the inhibit gate 28.

As described above, the test on the memory device 15 is carried out through a complex address pattern and it is usual to read out the same address many times, so that when a fault is first detected with respect to an address the result of comparison by the comparison circuit 19 is stored in the corresponding address in the fault-address memory 17, while the fault is counted by the counter 27. However, when a fault is detected again from the same address of the memory under test 15, then, prior to writing it, the same address in the fault-address memory 17 is accessed to read out therefrom the previously stored disagreement data, which produces a high level at the output of the OR-circuit 29 and comparison read out from the fault-address memory 17, the inhibit gate 28 is set to inhibit by the output from the OR-circuit 29. Accordingly, the disagreement currently detected by the comparison circuit 19 is not counted by the counter 27. In other words, only when the inconsistency detected by the comparison circuit 19 is the first time for the address is the output of the inhibit gate 28 set to the high logic level, and thus a clock signal from the terminal 32 passes through the AND-gate 31 and is counted once by the counter 27.

The test equipment is usually designed so that when the number counted by this counter 27 exceeds a predetermined value a fault signal is generated. Thus, the complement on this predetermined value for the full set on the digits of the counter 27 may be stored in a register 33, the content of the register 33 is loaded in the counter 27 at the start of testing, and the counter 27 is designed to up-count by one every time a clock signal is given to the clock terminal CK of the counter 27. When the content of the counter 27 goes up to the full count, corresponding to the predetermined value, the output terminal 34 of the counter 27 turns to high level which is then given to a gate 35. In the case of a mode of operation for generating the fault signal is generated when the number of faults exceeds the predetermined value a high level signal is applied to the gate 35 through terminal 36 of a decoder 41 to open the gate 35. Thus, when the counting of the number of clock signals by the counter 27 reaches the full count or the predetermined value, the output of the gate 35 turns to high level and the fault signal is given to a terminal 38 through an OR-circuit 37. This fault signal is supplied to the pattern generator 11 (FIG. 1) which then judges that the memory device 15 being currently tested is faulty and the test terminates.

The presetting of the counter 27 and the controlling of various gates are executed as described hereinafter. An address bus 39 is connected with the control section 23 and with the decoder 41. When a command issued by the control section 23 and given to the address bus 39 is decoded by the decoder 41 and, as a result, is interpreted as a load command for the counter 27, a high level output obtained at the terminal 42 of the decoder 41 is supplied to the load terminal L of the counter 27 to preset the content of the register 33 into the counter 27. In the case of a mode in which, if the number of faulty spots in the memory device 15 exceeds the predetermined value the memory device 15 is considered faulty, when a command representing such mode is given to the address bus 39, the terminal 36 of the decoder 41 is turned to high level and the gate 35 is opened. In the case of a mode in which if even only one faulty spot exists in the memory device under test it is considered faulty, when such mode command is supplied from the control section 23 to the address bus 39 the terminal 43 of the decoder 41 is turned to high level which in turn opens a gate 44 which is also supplied with the output of the OR-circuit 26, and thus the output of the gate 44 is supplied to the OR-circuit 37. Accordingly, when even only one fault bit is detected in the memory device being tested a fault signal is generated at the terminal 38.

Figure 3:
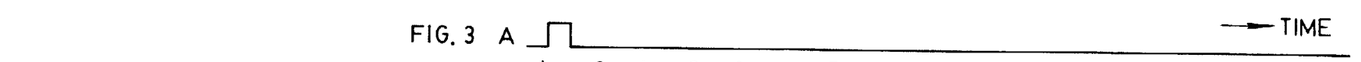

For example, as illustrated in FIG. 3A, a test start signal is issued at $t_1$, whereby the counter 27 is preset as aforementioned, and the reference clock pulse for this test apparatus is prepared as illustrated in FIG. 3B. On the other hand, the clock pulses at the terminal 32 is prepared with a time lag of half the period relative to the reference clock pulses, as shown in FIG. 3C. The memory device 15 is accessed in response to each reference clock shown in FIG. 3B and the output of memory device 15 is compared with the expected data. As shown in FIG. 3B, a train of the reference clock pulses are numbered 1, 2, 3, . . . for convenience. For example, a disagreement signal is generated by the comparison circuit 19 at every clock pulse numbered 1, 2, 4, 6, 7, 8, 11, 13, 14 as shown in FIG. 3D. These disagreement signals are to be stored in the fault-address memory 17, but if the same addresses corresponding to the clock pulses 8 and 11 have already been accessed, then disagreement signals for these addresses also have already been stored in the fault-address memory 17. In this case, high level signals are outputted from the OR-circuit 29 at clock pulses 8 and 11 as shown in FIG. 3E. Accordingly, the output signals from the OR-circuit 26 at clocks 8 and 11 are blocked by the inhibit gate 28, and thus the disagreement signals are allowed to pass through the inhibit gate 28 by the clock pulses 1, 2, 4, 6, 7, 13, 14, as shown in FIG. 3F.

The output of this inhibit gate 28 is given to the gate 31, whereby the clock pulses of FIG. 3C at the terminal 32 are selectively passed through the gate 31 as shown in FIG. 3G, and counted by the counter 27. For example, supposing that the counter 27 generates a fault signal when it counts seven clock pulses, the output of the terminal 34 is turned to high level by the counting operation of the counter 27 resulting from the disagreement signal generated when testing is conducted at clock pulse 14, as shown in FIG. 3H, a fault signal being thereby obtained. In order to examine whether a disagreement signal is obtained or not for every access in the entire address pattern for the memory device 15 without generating any fault signal even when the counter 27 counts a predetermined value as above, it is sufficient simply to keep the terminals 36 and 43 at low level so that the test will not be terminated by generation of the fault signal.

As described above, according to the memory device test apparatus of the present invention, address patterns are sequentially issued to detect the consistency and inconsistency between the output of the memory device under test and the expected data, whereby the memory device is judged acceptable or unacceptable depending upon whether the number of faulty spots is lower or higher than a predetermined value. Consequently, when a fault signal is detected, the test on the current memory device is terminated and moves to the test on the next memory device.

To perform a full fault analysis of the memory device under test, both the terminals 36 and 43 are kept at low level to continue the test without stopping the operation of the pattern generator 11 even when disagreement is detected by the comparison circuit 19, until the generation of the entire address pattern for the memory device under test is completed, while the comparison results from the comparison circuit 19 are stored in the fault-address memory 17. In the case that the content of the register 33 has not loaded in the counter 27, the number of faulty spots in the memory device is counted by the counter 27. When the address bus 39 is given a counter read-out command, the terminal 45 of the decoder 41 is turned to high level and in turn a gate 47 is opened, through which the counted value of the counter 27 is given to the data bus 48 and fetched into the control section 23.

After completing the test, disagreement data stored in the fault-address memory 17 are fetched into the control section 23 to perform a fault analysis. In the present invention, the fetch of the disagreement data is carried out as follows. As illustrated in FIG. 2, an address counter 49 for accessing the fault-address memory 17 is provided. When the control section 23 supplies an address set command and a start address to the address bus 39, the address set command is decoded by the decoder 41 and its terminal 51 is turned to high level which is then given to the load terminal L of the address counter 49 and the start address is set in the counter 49. This start address and the address set command are simultaneously supplied to different bit lines in the address bus 39, respectively. Next, when the control section 23 issues an access start command to the address bus 39, the command is decoded by the decoder 41 and the terminal 52 is turned to high level by which a flip-flop 53 is set to act as a counter operation signal generating circuit and its Q-output is turned to high level, through which the ENABLE terminal E of the address counter 49 is effected and thus the address counter 49 starts operating. Accordingly, the content of address counter 49 increases successively from the start address loaded previously.

The content of the address counter 49 is given as an address to the fault-address memory 17 through the OR-circuit 25 and the content of the address is read out. The disagreement data in the read-out outputs from the fault-address memory 17 are thus detected. For example, if every word of the fault-address memory 17 consists of a plurality of bits and a data representing disagreement exists in an arbitrary bit of a word, the fault in a bit of that word can be detected as follows. The output of the fault-address memory 17 is supplied to the OR-circuit 29 where a logic summation of all the bits is taken and the output of the OR-circuit 29 is then supplied to an AND-circuit 54 which is supplied also with the output from the counter operation signal generating circuit 53, so that the one input of the AND-circuit 54 keeps high level during the operation of the counter 49. As a result, when a disagreement is detected from the fault-address memory 17, the output of the AND-circuit 54 is turned to high level and the output signal is given to the reset terminal of the flip-flop 53 via an OR-gate 55 to reset the flip-flop 53, that is, the counter operation signal from counter operation signal generating circuit 53 is halted.

The address bus 39 is supplied with a monitor command periodically from the control section 23 and the monitor command given is then decoded by the decoder 41, whereby the terminal 56 is turned to high level which in turn opens a gate 57. The gate 57 is also given the Q-output of the flip-flop 53, and the output of the gate 57 is fetched into the control section 23 through the data bus 48 to check whether the counter 49 is in operation or not. When the control section 23 detects that the counter 49 has halted, it supplies a termination check command to the address bus 39 and the command is then decoded by the decoder 41 which in turn sets the terminal 58 to high level and the gate 59 is opened. The gate 59 also is given the output signal from the OR-circuit 29. The output signal from the gate 59 is fetched into the control section 23 through the data bus 48, and if the output signal is at low logic level it is judged that the read-out operation for the memory 17 has been terminated, while if the output signal is at high level it is judged that a disagreement data has been out, and both the output of the address counter 49 and that of the fault-address memory 17 at that time are read into the control section 23. That is, the data read out from the fault-address counter 17 and the content of the address counter 49 are supplied to gates 61 and 62, respectively, while the address bus 39 is given a read command by the control circuit 23 and the read command is then decoded by the decoder 41, whereby the terminal 63 is turned to high level which in turn causes the gates 61 and 62 to open and, as a result, the content of the fault-address memory 17 and that of the address counter 49 are simultaneously or sequentially read into the control section 23 through the data bus 48.

As described above, only when the data representing a faulty spot stored in the fault-address memory 17 is detected, are the address where the data is detected and the content read-out from the fault-address memory 17 at that time fetched into the control section 23. After they are fetched, the control section 23 provides the address bus 39 with an access restart command and sets the flip-flop 53, whereby a counter operating signal is generated again to cause the address counter 49 to operate, thereby the above procedure being repeated. Thus, all the addresses of the fault-address memory 17 are accessed, and only disagreement data read out from the fault-address memory 17 and the corresponding addresses obtained from the address counter 49 are fetched into the control section 23. When the accessing of all the addresses of the fault-address memory 17 is completed, the terminal 64 of the address counter 49 is supplied with an access termination signal which then resets the flip-flop 53 via the OR-circuit 55 to halt the counter operation signal and thereby to halt the operation of the address counter 49. Thus, the termination of fetching the data read out from the fault-address memory 17 into the control section 23 is recognized in accordance with the output of the gate 59 being at low level when it is fetched into the control section 23.

The operation for obtaining the access termination signal at the terminal 64 can be realized by designing the address counter 49 so as to generate the access termination signal when the content of the address counter 49 reaches a predetermined value, or by providing a termination register, presetting therein an end address to terminate the read-out operation of the fault-address memory 17, and comparing the end address in the termination register with the content of the address counter 17 so as to generate the access termination signal at the terminal 64 when both coincide with each other.

As described above, according to the memory device test apparatus of the present invention, not all the data loaded in the fault-address memory 17 are fetched into the control section 23 or CPU but only the addresses corresponding to the disagreement data are fetched. Since the actual number of fault data stored in the fault-address memory 17 is very small, the number of times of fetching the fault data into the control section 23 is small. One fetching operation takes approximately one microsecond, while the access time for sequentially reading out data from the fault-address memory 17 can be shortened to as little as 20 nanoseconds; therefore, in comparison with the case of fetching the contents of all the addresses of the fault-address memory 17 into the control section 23, the time necessary for the apparatus shown in FIG. 2 to fetch the data is extremely short, and it is possible to realize a very high speed operation of fetching out, from the fault-address memory 17, addresses of faulty spots and their contents necessary to carry out the fault analysis of a memory device under test. In the case where each word of the memory device under test consists of one bit, only one bit simply indicating good or bad is stored in each address of the fault-address memory 17, and thus it is good enough to fetch only the content of the counter 49 into the control section 23 when fault data is detected.

As explained before, the embodiment of FIG. 2 shows an example where one word of the memory device under test consists of a plurality of bits, and the content of each address is examined if it agrees with the expected value. When the number of disagreements exceeds a predetermined reference value, a fault signal is generated.

Figure 4:
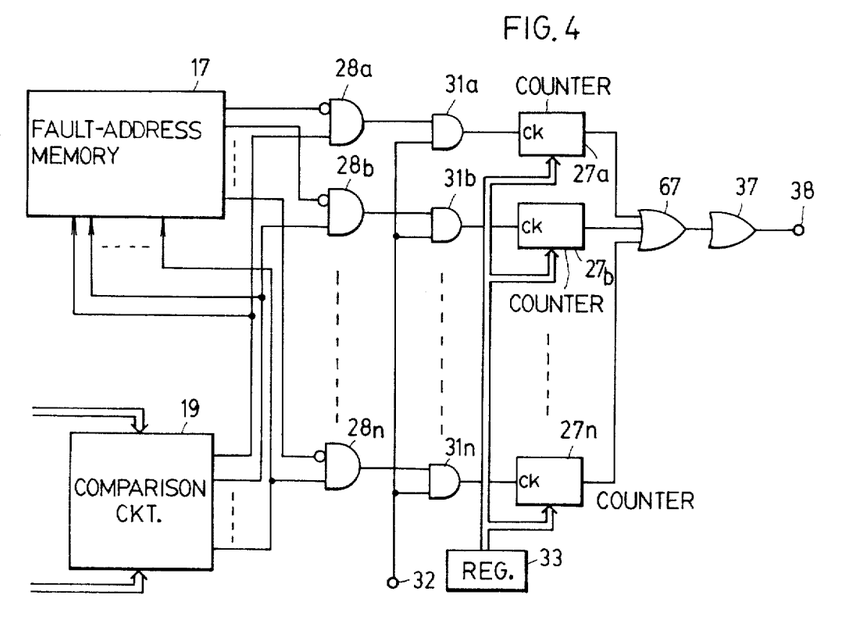
FIG. 4 is a block diagram illustrating the main part of another embodiment of the semi-conductor memory test apparatus according to the present invention.

However, it is also possible to arrange such that the number of disagreements is counted for the corresponding bits of each word and when the count value corresponding to any one of the bits exceeds a predetermined value, a fault signal is generated. For example, as shown in FIG. 4, in the comparison circuit 19 comparison is performed in a bit-to-bit manner between the data read out from the memory device under test and the expected data. The result of comparison is written in the fault-address memory 17 and at the same time the corresponding bits of the comparison result are supplied to the respective inhibit gates 28a to 28n, while the corresponding bits of the data read out from the fault-address memory 17 have been supplied to the respective inhibit gates 28a to 28n prior to the abovesaid writing of the comparison result into the fault-address memory 17. In other words, the fault-address memory 17 is accessed first to read out the contents of the corresponding address and then the write therein the comparison result. The outputs of the inhibit gates 28a to 28n are supplied to gates 31a to 31n, respectively, all of which are also supplied with a clock signal from the terminal 32. The outputs of the gates 31a to 31n are counted by the respective counters 27a to 27n, into all of which the content of the register 33 has been preset prior to the test. The outputs of the counters 27a to 27n are supplied respectively to the OR-circuit 37 via an OR-circuit 67. When one of the counters 27a to 27n counts a predetermined value, the terminal 38 generates a fault signal. In the present invention, each of the counters 27 or 27a to 27n may also be designed so as to preset a predetermined value, down-count the clocks, and generate a high level output when the count value reaches zero.

What is claimed is:

1. An apparatus for testing a memory device, comprising
   a pattern generator for generating and supplying test patterns to the memory device, including address patterns for accessing the addresses of the memory device,
   expected value pattern generating means for providing expected data which is expected to correspond to data stored in each respective address of the memory device, in correspondence with the generation of addresses of said address patterns,
   a comparison circuit for reading out the memory device, for comparing the respective data read out from the memory device and the respective expected data, and for outputting a disagreement signal when the read-out data and the expected data do not agree as defect data of the respective address of the memory device, in correspondence with the generation of addresses of said address patterns,
   a fault-address memory comprising means for being accessed to read out the content of the respective address thereof, and for subsequently writing any respective defect data that is outputted from said comparison circuit into the same corresponding address, in correspondence with said generation of addresses of said address patterns,
   a counter for counting the number of said defect data outputted from said comparison circuit,
   means for inhibiting said counting of said counter when said output from said fault-address memory is a previously stored defect data corresponding to the same respective address of said memory device, and
   fault signal generating means for generating a fault signal to stop said generation of test patterns when the number counted by said counter exceeds a predetermined value.

2. The apparatus of claim 1,
   said counter comprising an up-counter and means for outputting an overflow signal upon reaching a predetermined count limit, and
   said apparatus comprising means for setting, for each test of said memory device, the complement of said predetermined count limit into said counter.

3. The apparatus of claim 1 or 2 comprising
   each said data read out from said memory device and each said expected data comprising a plurality of bits for each said address of said address patterns, and each said address of said memory device comprising at least the same said plurality of bits,
   said comparison circuit comprising means for comparing the respective bits of said data read out from said memory device with said expected data, and for outputting said disagreement signal with corresponding defect data bits,
   said fault-address memory storing said defect data at respective bits of the corresponding address,
   said counter comprising individual counting means for each said bit of the addresses of said address patterns, and
   said fault signal generating means comprising means for generating said fault signal when the number counted by any one of said individual counting means exceeds said predetermined value.

4. The apparatus of claim 1, or 2 comprising selection means for selectively outputting each said disagreement signal output from said comparison circuit and said fault signal, to supply the selected one as the signal to stop said generation of test patterns.

5. An apparatus for testing a memory device, comprising
   a pattern generator for generating and supplying test patterns to the memory device, including address patterns for accessing the memory device,
   expected value pattern generating means for generating expected data corresponding to the data that is expected to be stored at the respective address in said memory device, in correspondence with the generation of said address patterns,
   a comparison circuit for comparing the data read out from said memory device with said expected data, for detecting each disagreement therebetween and for outputting a respective disagreement signal as defect data corresponding to a fault at the respective address of said memory device, in correspondence with said generation of addresses of said address patterns,
   a fault-address memory for storing said defect data output from said comparison circuit at the addresses corresponding to the defective addresses of said memory device, in correspondence with said generation of address of said address patterns,
   an address counter for generating addresses for reading out said fault-address memory,
   defect data detecting means for detecting each one of said defect data that is read out from said fault-address memory,
   address counter control means for advancing said address counter in one direction in response to an access command, and for stopping the advancement of said address counter in response to the detection of each said defect data by said fault data detecting means, and
   a control section for selectively accessing said fault-address memory by generating said access command for said address counter control means, for determining that said address counter control means has stopped as a result of detecting one of said defect data, and for fetching therein the content of said address counter corresponding to each said stopping of the address counter.

6. The apparatus of claim 5, wherein said control section comprises means for fetching therein the respective output of said fault-address memory when fetching each said address from said address counter control means.

7. The apparatus of claim 5, or 6, wherein said control section comprises means for monitoring whether said address counter is incrementing for performing said selective accessing, and for fetching the defect data corresponding to the address in said address counter when said address counter has stopped incrementing.

8. The apparatus of claim 1, 2, 5, 6, wherein said expected value pattern generating means is contained in said pattern generator and comprises means for generating said expected data by means of a logic operation.

9. The apparatus of claim 1, 2, 5, or 6, wherein
said expected value pattern generating means is a memory, and
said control system comrises means for providing said expected data to respective addresses of said memory at the beginning of each said test, to be read out in synchronism with said generation of addresses of said address patterns.

10. The apparatus of claim 1, comprising
a control section for selectively accessing said fault-address memory,
an address counter for selectively generating addresses for accessing said fault-address memory for selective fetching of said defect data from the respective addresses of said fault-address memory,
defect data detecting means for detecting each said defect data read out from said fault-address memory during said selective fetching,
address counter control means for, in response to an access command, incrementing said address counter in one direction, and for stopping the incrementing of said address counter in response to the detection of each said defect data by said defect data detecting means during said selective fetching, and
a control section for generating said access command, for determining that said address counter has stopped incrementing, and for fetching the content of said address counter corresponding to each said defect data of said selective fetching.

11. The apparatus of claim 10, wherein said counter counts each time one of said defect data is output from said fault-address memory during the selective fetching, and
wherein said control section fetches the count content of said counter as the respective number of the defective addresses of the memory device.

12. The apparatus of claim 1, 2, 5, 6, 10 or 11, said test patterns generated by said test pattern generator including write data patterns which are written into the respective addresses of the memory device in correspondence with said generation of addresses of said address patterns.

13. The apparatus of claim 3, said test patterns generated by said test pattern generator including write data patterns which are written into the respective addresses of the memory device in correspondence with said generation of addresses of said address patterns, each said write data comprising the same said plurality of bits.

14. The apparatus of claim 8, said test patterns generated by said test pattern generator including write data patterns which are written into the respective addresses of the memory device in correspondence with said generation of addresses of said address patterns.

* * * * *

UNITED STATES PATENT AND TRADEMARK OFFICE
CERTIFICATE OF CORRECTION

PATENT NO. : 4,414,665
DATED : November 8, 1983
INVENTOR(S) : Kimura et al

It is certified that error appears in the above-identified patent and that said Letters Patent is hereby corrected as shown below:

Col. 4, line 22, "cumulation" should be --accumulation--;
line 51, delete "comparison read";
line 52, delete "out from the fault-address memory 17,";
line 65, "on" should be --of--;
line 66, "on" should be --of--.

Col. 5, line 7, delete "is generated";
line 25, delete "the".

Col. 6, line 42, after "not" insert --been--;
line 58, after "39" insert --and data bus 48--.

Col. 7, line 49, after "been" insert --read--.

Col. 9, line 26, delete "27 or".

Signed and Sealed this

Twenty-fourth Day of July 1984

[SEAL]

Attest:

GERALD J. MOSSINGHOFF

Attesting Officer   Commissioner of Patents and Trademarks